United States Patent
Wenxu et al.

(10) Patent No.: US 8,921,220 B2
(45) Date of Patent: Dec. 30, 2014

(54) SELECTIVE LOW-TEMPERATURE OHMIC CONTACT FORMATION METHOD FOR GROUP III-NITRIDE HETEROJUNCTION STRUCTURED DEVICE

(75) Inventors: Xianyu Wenxu, Suwon-si (KR); Jeong-Yub Lee, Seoul (KR); Chang-youl Moon, Suwon-si (KR); Yong-Young Park, Daejeon (KR); Woo Young Yang, Hwaseong-si (KR); Jae-Joon Oh, Seongnam-si (KR); In-Jun Hwang, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 6 days.

(21) Appl. No.: 13/599,980

(22) Filed: Aug. 30, 2012

(65) Prior Publication Data
US 2013/0252410 A1    Sep. 26, 2013

(30) Foreign Application Priority Data

Mar. 23, 2012 (KR) .................. 10-2012-0030245

(51) Int. Cl.
*H01L 21/28* (2006.01)
*H01L 21/3205* (2006.01)

(52) U.S. Cl.
USPC .......................... 438/604; 438/605

(58) Field of Classification Search
USPC .................................. 438/604, 605
See application file for complete search history.

(56) References Cited

U.S. PATENT DOCUMENTS 8,097,532 B2 * 1/2012 Shakuda ............... 438/605
8,569,735 B2 * 10/2013 Hiraiwa et al. ............... 257/13
2008/0105880 A1    5/2008 Edwards et al.
2008/0122542 A1    5/2008 Bowles et al.
2008/0128678 A1    6/2008 Lee (Continued)

FOREIGN PATENT DOCUMENTS

KR    1019960026427    7/1996
KR    1019960039215    11/1996

(Continued)

OTHER PUBLICATIONS

Wang, Grace H. "Reduced Contact Resistance and Improved Surface Morphology of Ohmic Contacts on GaN Employing KrF Laser Irradiation" Jap. Jour. of App. Phys. 50 Apr. 20, 2011 pp. 04DF06-1 through 04DF06-6.*

(Continued)

*Primary Examiner* — Yu-Hsi D Sun
*Assistant Examiner* — Grant Withers
(74) *Attorney, Agent, or Firm* — Harness, Dickey & Pierce, P.L.C.

(57) ABSTRACT

A method for forming a selective ohmic contact for a Group III-nitride heterojunction structured device may include forming a conductive layer and a capping layer on an epitaxial substrate including at least one Group III-nitride heterojunction layer and having a defined ohmic contact region, the capping layer being formed on the conductive layer or between the conductive layer and the Group III-nitride heterojunction layer in one of the ohmic contact region and non-ohmic contact region, and applying at least one of a laser annealing process and an induction annealing process on the substrate at a temperature of less than or equal to about 750° C. to complete the selective ohmic contact in the ohmic contact region.

8 Claims, 8 Drawing Sheets

(56) References Cited

U.S. PATENT DOCUMENTS

| | | |
|---|---|---|
| 2008/0258150 A1 | 10/2008 | McCarthy et al. |
| 2009/0001389 A1 | 1/2009 | Wang et al. |
| 2009/0072272 A1 | 3/2009 | Suh et al. |
| 2009/0091011 A1 | 4/2009 | Das et al. |
| 2009/0191674 A1 | 7/2009 | Germain et al. |
| 2009/0261346 A1 | 10/2009 | Chen et al. |
| 2010/0019279 A1 | 1/2010 | Chen et al. |
| 2010/0096668 A1 | 4/2010 | Briere |
| 2010/0102359 A1 | 4/2010 | Khan et al. |
| 2010/0170325 A1 | 7/2010 | Ren et al. |
| 2010/0230722 A1 | 9/2010 | Chang et al. |
| 2011/0024775 A1 | 2/2011 | Zimmerman et al. |
| 2011/0062579 A1 | 3/2011 | Mishra et al. |
| 2011/0068371 A1 | 3/2011 | Oka |
| 2011/0121261 A1 | 5/2011 | Lee |
| 2011/0121314 A1 | 5/2011 | Suh et al. |
| 2011/0140121 A1 | 6/2011 | Lee et al. |
| 2011/0198611 A1 | 8/2011 | Cheah et al. |
| 2013/0092942 A1* | 4/2013 | Park et al. .................. 257/57 |
| 2013/0105863 A1* | 5/2013 | Lee et al. .................. 257/194 |

FOREIGN PATENT DOCUMENTS

| | | |
|---|---|---|
| KR | 20080046386 A | 5/2008 |
| KR | 100838756 B1 | 6/2008 |
| KR | 20110024697 A | 3/2011 |

OTHER PUBLICATIONS

Wong, W. S. "Fabrication of thin-film InGaN light-emitting diode membranes by laser lift-off" App. Phys. Lett vol. 75, No. 10 Sep. 6, 1999 pp. 1360-1362.*

Wikipedia entry on Gold as of Dec. 20, 2013 available online at http://en.wikipedia.org/wiki/Gold.*

Thermal Conductivity Article as of Dec. 20, 2013 available online at http://hyperphysics.phy-astr.gsu.edu/hbase/tables/thrcn.html.*

Hibbard, D. L. "Low Resistance high reflectance contacts to p-GaN using oidized Ni/Au and Al or Ag" Appl. Phys. Lett. 83, 311 (Jul. 14, 2003) pp. 311-313.*

Nakamura, S. "Candelaclass highbrightness InGaN/AlGaN doubleheterostructure bluelight emitting diodes" App. Phys. Lett. 64, 1687 (Mar. 28, 1994) pp. 687-689.*

Lee, Chi-Sen "Investigation of oxidation mechanism for ohmic formation in Ni/Au contacts to p-type GaN layers" App. Phys. Lett. vol. 79, No. 23 Dec. 3, 2001 pp. 3815-3817.*

Ho, Jin Kuo "Low-resistance ohmic contacts to p-type GaN achieved by the oxidation of Ni/Au films" App. Phys. Lett. vol. 86, No. 8 Oct. 15, 1999 pp. 4491-4497.*

* cited by examiner

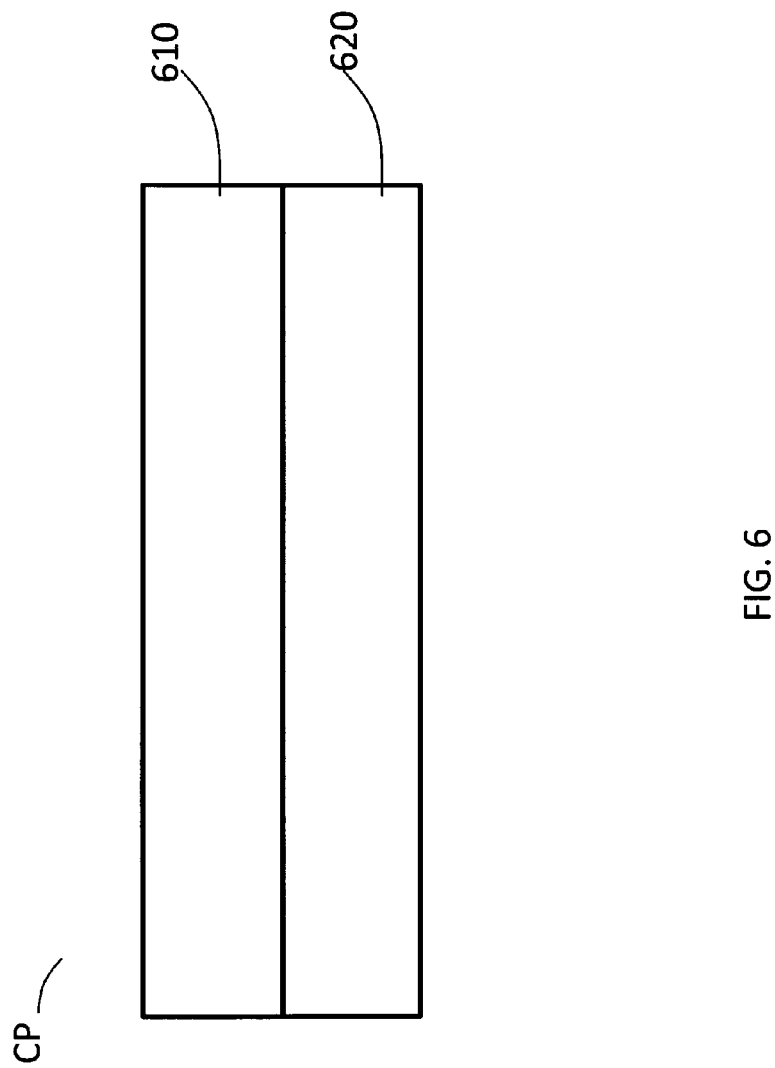

SELECTIVE LOW-TEMPERATURE OHMIC CONTACT FORMATION METHOD FOR GROUP III-NITRIDE HETEROJUNCTION STRUCTURED DEVICE

CROSS-REFERENCE TO RELATED APPLICATION

This application claims priority to and the benefit of Korean Patent Application No. 10-2002-0030245 filed in the Korean Intellectual Property Office on Mar. 23, 2012, the entire contents of which are incorporated herein by reference.

BACKGROUND

1. Field

Example embodiments relate to a method of manufacturing a Group III-nitride heterojunction structured device, for example, a selective low-temperature ohmic contact formation method for a Group III-nitride heterojunction structure.

2. Description of the Related Art

A Group III-nitride heterojunction structured device stands out in the field of electric power or optics. The Group III-nitride heterojunction structured device is useful for embodying a power device or LED (light emitting device) that may discharge a high current and support a relatively high pressure.

Therefore, with the recent acceleration of research and development and commercialization of photovoltaics, electric vehicles, and LEDs, there is increasing demand for studies and commercialization of the Group III-nitride heterojunction structured device.

However, because an ohmic contact metal layer is formed at a relatively high temperature of about 800-900° C. according to thus-far developed manufacturing methods of the Group III-nitride heterojunction structured device, the gate insulating layer exposed to a relatively high temperature process may be crystallized and/or dehydrogenated, thereby deteriorating device characteristics.

Furthermore, according to the currently used manufacturing method of the Group III-nitride heterojunction structured device, a gate electrode is formed using gold (Au) and requires a lift-off process, which is expensive and has undesirable etching characteristics, and thus has lower reproducibility. Accordingly, economic feasibility and reproducibility of the process are relatively low.

SUMMARY

Example embodiments provide a method for forming a selective low-temperature ohmic contact for a Group III-nitride heterojunction structured device, which may prevent or inhibit damage to a gate insulating layer. Example embodiments also provide a method for forming a selective low-temperature ohmic contact for a Group III-nitride heterojunction structured device, to which an etching process may be applied and which is economically feasible.

According to example embodiments, a method for forming a selective ohmic contact for a Group III-nitride heterojunction structured device may include forming a conductive layer and a capping layer on an epitaxial substrate including at least one Group III-nitride heterojunction layer and having a defined ohmic contact region, the capping layer being formed on the conductive layer or between the conductive layer and the Group III-nitride heterojunction layer in one of the ohmic contact region and non-ohmic contact region, and applying at least one of a laser annealing process and an induction annealing process on the substrate at a temperature of less than or equal to about 750° C. to complete the selective ohmic contact in the ohmic contact region.

The capping layer may be formed on the non-ohmic contact region, and the capping layer may include one of a laser reflective layer and a thermally conductive layer. The capping layer may include a double layer of the laser reflective layer and a barrier film, the laser reflective layer may include an aluminum layer, and the barrier film may include a silicon oxide layer. The capping layer may include the thermally conductive layer, and the thermally conductive layer may include one selected from a silicon nitride layer, an aluminum nitride layer, a boron nitride layer, an aluminum oxide layer, and a beryllium oxide layer.

The capping layer may be formed on the non-ohmic contact region, and the capping layer may include a material having a smaller laser reflectance than the conductive layer. The capping layer may include a silicon oxide layer having a thickness of about 50 nm. The at least one Group III-nitride heterojunction layer may include a first Group III-nitride layer and a second Group III-nitride layer, the first Group III-nitride layer may be one of a GaN layer and an InGaN layer, and the second Group III-nitride layer may be one of an AlGaN layer, an AlInN layer, an AlGaInN layer, and an AlN layer. A laser used in the laser annealing process may be one of the laser is a pulsed KrF 248 nm laser and a XeCl 308 nm laser.

According to example embodiments, a method for forming a selective ohmic contact for a Group III-nitride heterojunction structured power device may include forming a gate insulating layer on an epitaxial substrate, the epitaxial substrate including at least one Group III-nitride heterojunction layer, patterning the gate insulating layer to expose a source/drain region, forming a conductive layer on the epitaxial substrate, forming a capping layer pattern for masking a non-ohmic contact region other than the source/drain region, applying at least one of a laser annealing process and an induction annealing process on the substrate at a temperature of less than or equal to about 750° C. to complete the selective ohmic contact in the source/drain region, removing the capping layer pattern, and patterning the conductive layer to form a gate electrode and source/drain electrode.

The capping layer pattern may include one of a laser reflective layer and a thermally conductive layer. The capping layer may include a double layer of the laser reflective layer and a barrier film, the laser reflective layer may include an aluminum layer, and the barrier film may include a silicon oxide layer. The at least one Group III-nitride heterojunction layer may include a first Group III-nitride layer and a second Group III-nitride layer, the first Group III-nitride layer may be one of a GaN layer and an InGaN layer, the second Group III-nitride layer may be one of an AlGaN layer, an AlInN layer, an AlGaInN layer, and an AlN layer, and the conductive layer may be a double layer of an aluminum-based metal layer and an ohmic contact metal layer.

According to example embodiments, a method for forming a selective ohmic contact for a Group III-nitride heterojunction structured power device may include forming a capping layer pattern on a non-ohmic contact region other than a source/drain region of an epitaxial substrate, the epitaxial substrate including a first Group III-nitride layer and a second Group III-nitride layer, forming a conductive layer on the substrate, applying at least one of a laser annealing process and an induction annealing process on the substrate at a temperature of less than or equal to about 750° C. to complete the selective ohmic contact in the source/drain region, patterning the conductive layer having the completed selective ohmic contact to form a source/drain electrode, forming a passivation layer for covering the source/drain electrode and exposing a channel region, removing the second Group III-nitride layer of the channel region, forming a gate insulating layer contacting the first Group III-nitride layer, and forming a gate electrode on the gate insulating layer.

The capping layer pattern may include one of a laser reflective layer and a thermally conductive layer. The capping layer may include a double layer of the laser reflective layer and a barrier film, the laser reflective layer may include an aluminum layer, and the barrier film may include a silicon oxide layer. The thermally conductive layer may include one selected from a silicon nitride layer, an aluminum nitride layer, a boron nitride layer, an aluminum oxide layer, and a beryllium oxide layer.

According to example embodiments, a method for forming a selective ohmic contact for a Group III-nitride heterojunction structured power device may include forming a capping layer pattern on a non-ohmic contact region other than a source/drain region of an epitaxial substrate, the epitaxial substrate including a first Group III-nitride layer, a second Group III-nitride layer and a p-type Group III-nitride layer, forming a conductive layer on the substrate, applying at least one of a laser annealing process and an induction annealing process on the substrate at a temperature of less than or equal to about 750° C. to complete the selective ohmic contact in the source/drain region, patterning the conductive layer having the completed selective ohmic contact to form a source/drain electrode, forming a passivation layer for covering the source/drain electrode and exposing a channel region, forming a gate metal layer, and patterning the gate metal layer and the p-type Group III-nitride layer to form a gate electrode.

The capping layer pattern may include one of a laser reflective layer and a thermally conductive layer. The capping layer may include a double layer of the laser reflective layer and a barrier film, the laser reflective layer may include an aluminum layer, and the barrier film may include a silicon oxide layer. The thermally conductive layer may include one selected from a silicon nitride layer, an aluminum nitride layer, a boron nitride layer, an aluminum oxide layer, and a beryllium oxide layer.

Because the ohmic contact is formed at a relatively low temperature, thermal stress applied to the substrate may be reduced. Therefore, damage to a gate insulating layer may be minimized or reduced.

Further, because ohmic contact formation is selectively progressed in the ohmic contact region, thermal damage to the non-ohmic contact region may be minimized or reduced. Because a relatively low temperature process is possible, an aluminum electrode to which an inexpensive etching process may be applied may be used instead of a gold electrode. Thus, economic feasibility and reproducibility of the process may be improved.

BRIEF DESCRIPTION OF THE DRAWINGS

These and/or other aspects will become apparent and more readily appreciated from the following description of example embodiments, taken in conjunction with the accompanying drawings of which:

FIG. 6 is a cross-sectional view of a capping layer, according to an example embodiment.

DETAILED DESCRIPTION

Figure 1A:
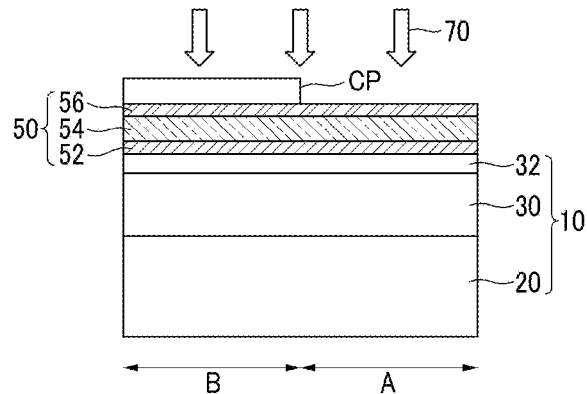
FIGS. 1A to 1D are cross-sectional views for explaining a selective ohmic contact formation method for a Group III-nitride heterojunction structured device according to example embodiments.

The advantages and characteristics of the inventive concepts, and the method of achieving them, will be clearly understood referring to accompanying drawings and example embodiments.

However, the inventive concepts are not limited to the following example embodiments, and it may be realized with different embodiments. Example embodiments are provided to complete the disclosure of the inventive concepts and aid understanding of a person having ordinary knowledge in the art to fully understand the inventive concepts, and the inventive concepts are defined by the claims.

Thus, in some example embodiments, well-known technologies are not specifically described to avoid ambiguous understanding of the inventive concepts. Example embodiments may be described referring to example cross-sectional and/or schematic diagrams. Thus, the example cross-sectional and/or schematic diagrams may be modified in compliance with a manufacture technology and/or permissible errors.

Example embodiments are not limited to depicted specific shapes, and may be modified in compliance with manufacturing processes. In drawings in this disclosure, each constituent element may be exaggerated or contracted for better understanding and ease of description. The same reference numerals designate the same constituent elements throughout the specification. Hereinafter, referring to the drawings, example embodiments are described.

It will be understood that, although the terms "first", "second", etc. may be used herein to describe various elements, components, regions, layers and/or sections, these elements, components, regions, layers and/or sections are not to be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments are not to be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, is to be interpreted as having a meaning that is consistent with their meaning in the context of the relevant art and will not be interpreted in an idealized or overly formal sense unless expressly so defined herein.

FIGS. 1A to 1D are cross-sectional views for explaining a selective ohmic contact formation method for a Group III-nitride heterojunction structured device according to example embodiments.

Referring to FIG. 1A to FIG. 1D, a Group III-nitride heterojunction structured device may be formed on an epitaxial substrate 10 including Group III-nitride heterojunction layers 30 and 32 on a semiconductor substrate 20. The semiconductor substrate 20 may be one of a silicon substrate and a sapphire substrate.

The Group III-nitride heterojunction layers 30 and 32 may consist of first and second Group III-nitride layers 30 and 32 having different polarizabilities and bandgaps. The first Group III-nitride layer 30 may be a GaN layer or an InGaN layer. The second Group III-nitride layer 32 may be an AlGaN layer, an AlInN layer, an AlGaInN layer, or an AlN layer.

The epitaxial substrate 10 includes an ohmic contact region A, and a non-ohmic contact region (B) in which a capping layer pattern (CP) is provided. The capping layer pattern (CP) may be provided on a conductive layer 50 as illustrated in FIG. 1A and FIG. 1B, or may be provided under the conductive layer 50 as illustrated in FIG. 1C and FIG. 1D.

Figure 1B:
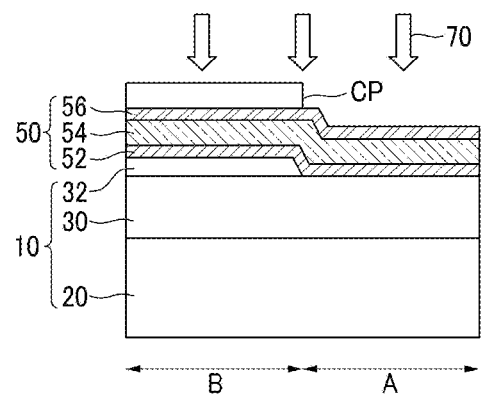
Figure 1C:
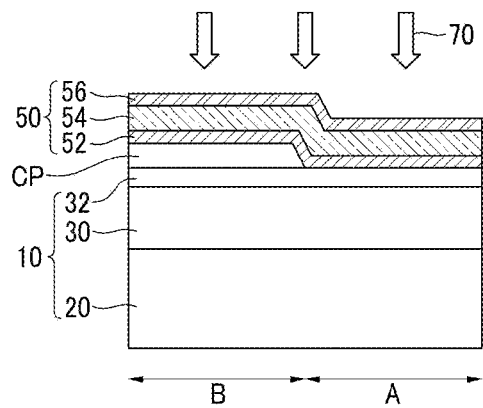
Figure 1D:
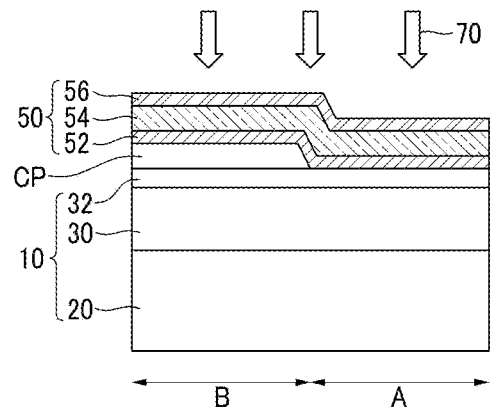

FIG. 1B and FIG. 1D show the case wherein, in the ohmic contact region (A), the second Group III-nitride layer 32 is removed so that the conductive layer 50 may contact the first Group III-nitride layer 30.

If an ohmic contact is formed by removing the second Group III-nitride layer 32 to contact the conductive layer 50 with the first Group III-nitride layer 30, a contact area with 2DEG (two-dimensional electron gas) that is generated at the boundary between the second Group III-nitride layer (e.g., AlGaN) 32 and the first Group III-nitride layer (e.g., GaN) 30 is increased compared to the case wherein an ohmic contact is formed by contacting the second Group III-nitride layer 32, and thus the contact area may be decreased.

The conductive layer 50 may be formed of a stacked layer of an oxidation-inhibiting conductive layer 56/an aluminum-based metal layer 54/an ohmic contact metal layer 52. The ohmic contact metal layer 52 may be formed of one of titanium (Ti), nickel (Ni), and gold (Au). The ohmic contact metal layer 52 may be formed with a thickness of about 5 to about 50 nm.

The aluminum-based metal layer 54 may be formed of one of aluminum (Al), an aluminum silicon alloy (Al—Si alloy), and an aluminum copper alloy (Al—Cu alloy). The aluminum-based metal layer 54 may be formed with a thickness of about 50 to about 250 nm. The oxidation-inhibiting conductive layer 56 may be formed to prevent or inhibit oxidation of the lower aluminum-based metal layer 54.

Oxidation may be prevented or inhibited by another method, or if oxidation is more easily controlled during the process, formation of the oxidation-inhibiting conductive layer 56 may not be necessary. The capping conductive layer 56 may be formed of one of a titanium nitride layer (TiN) and a tantalum nitride layer (TaN). The oxidation-inhibiting conductive layer 56 may be formed with a thickness of about 10 to about 50 nm.

In the cross-sectional structure illustrated in FIG. 1A to FIG. 1D, low-temperature rapid thermal annealing (LT-RTA) 70 is conducted to complete the ohmic contact in the ohmic contact region A. The rapid thermal processing annealing 70 may be conducted at a relatively low temperature of less than or equal to about 750° C. Thus, damage to the lower structure exposed to the rapid thermal processing annealing 70, for example, a gate insulating layer (not shown), may be prevented or inhibited.

The rapid thermal processing annealing 70 may be conducted at room temperature to about 600° C., for example, about 300 to about 500° C. The rapid thermal processing annealing 70 may be conducted by laser annealing or induction annealing. The laser annealing may be conducted using a pulsed KrF 248 nm laser or a XeCl 308 nm laser. The XeCl or KrF laser may be applied to example embodiments because the XeCl or KrF laser may produce a relatively large area uniform laser beam.

In the case of an IR diode laser, reflection may occur in metal, and thus, heating of metal is not efficient and a relatively large area uniform laser beam is not produced, while in the case of an XeCl or KrF laser, the wavelength is shorter than that of the IR diode laser, and thus the above problems are not raised.

The laser annealing may be progressed by irradiating the laser at a laser energy density of about 100 mJ/cm$^2$ to about 1.5 J/cm$^2$ under a nitrogen or argon atmosphere. The laser energy density should be greater than or equal to about 100 a mJ/cm2 so that the ohmic metal may be fused to form the ohmic contact, and it should be less than or equal to about 1.5 J/cm$^2$ so as to prevent or inhibit aggregation of fused metal and breakage of a thin film. For example, the laser energy density may be about 200 to about 500 mJ/cm$^2$.

The irradiation of the laser may be progressed by a one-shot or multi-shot method. Induction annealing may be conducted for about 1 sec to about 30 sec under conditions of an induction field of about 1-20 kHz and a coil current of about 10-100 A. The induction annealing may be applied alone, or a pre-annealing step may be further included before the induction annealing.

The pre-annealing may be conducted by the above-explained laser annealing, and it may be conducted while reducing the laser annealing energy density. If pre-annealing and induction annealing are used in combination, power may be reduced in the induction annealing. To prevent or inhibit formation of an ohmic contact in the non-ohmic contact region (B) during the rapid thermal processing annealing and selectively form an ohmic contact in the ohmic contact region (A), a capping layer pattern (CP) may be provided in the non-ohmic contact region (B).

The capping layer pattern (CP) may be provided on the conductive layer 50 as illustrated in FIG. 1A and FIG. 1B, or may be provided under the conductive layer 50 as illustrated in FIG. 1C and FIG. 1D.

If laser annealing irradiation is used as the rapid thermal processing annealing 70, the capping layer pattern (CP) may be formed of a material that may reflect a laser. For example, the capping layer pattern (CP) may be formed of a double layer of a laser reflective layer and a barrier film.

The laser reflective layer may reflect an incident laser to prevent or inhibit formation of the ohmic contact in the non-ohmic contact region (B). The laser reflective layer may be formed of aluminum (Al). The laser reflective layer may be formed with a thickness of about 150 to about 250 nm. The barrier film functions to separate the laser reflective layer and the conductive layer 50. The barrier film may be formed of a silicon oxide layer ($SiO_2$). The barrier film may be formed with a thickness of about 50 to about 150 nm.

Non-limitative examples of the capping layer pattern (CP) may include a double layer of an aluminum layer and a silicon oxide layer. If induction annealing is used for the rapid thermal processing annealing 70, the capping layer pattern (CP) may be formed of a material having improved thermal conductivity.

For example, the capping layer pattern (CP) may be formed of a silicon nitride layer, an aluminum nitride layer, a boron nitride layer, an aluminum oxide layer, or a beryllium oxide layer.

At a reference temperature of 600° C., thermal conductivity of the silicon nitride layer is about 30.1 W/mK, thermal conductivity of the aluminum nitride layer is about 140-250 W/mK, thermal conductivity of the boron nitride layer is about 33 W/mK, thermal conductivity of the aluminum oxide layer is about 26.75 W/mK, and thermal conductivity of the beryllium oxide layer is about 300 W/mK.

If the capping layer pattern (CP) is formed of a material having relatively high thermal conductivity, heat sinks more rapidly in the non-ohmic contact region (B) than the ohmic contact region (A), so as to selectively form the ohmic contact in the ohmic contact region (A).

Figure 2A:
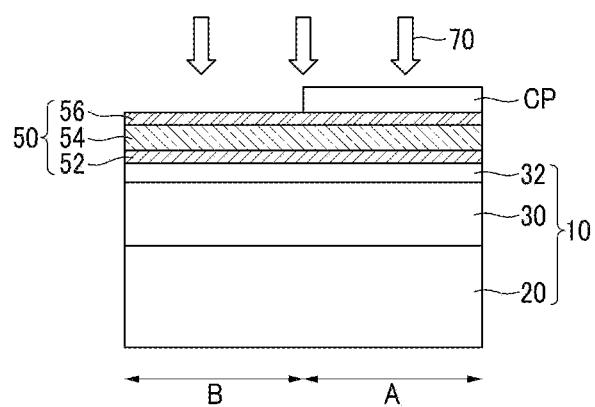
FIG. 2A and FIG. 2B are cross-sectional views for explaining the selective ohmic contact formation method for a Group III-nitride heterojunction structured device according to example embodiments.
Figure 2B:
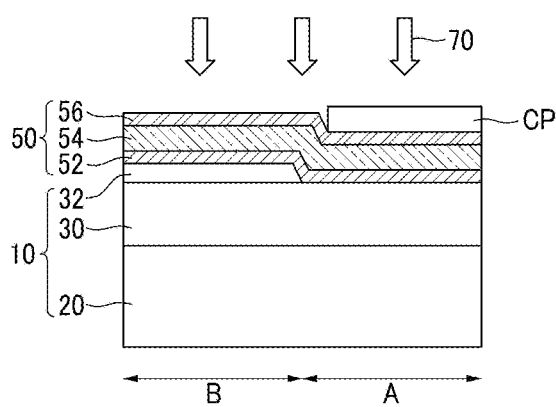

FIG. 2A and FIG. 2B are cross-sectional view for explaining the selective ohmic contact formation method for a Group III-nitride heterojunction structured device according to example embodiments.

Unlike the manufacturing method explained with reference to FIG. 1A to FIG. 1D, in the selective ohmic contact formation method illustrated in FIG. 2A and FIG. 2B, the capping layer pattern (CP) is formed on the ohmic contact region A.

In example embodiments, the capping layer pattern (CP) may be formed of a material having smaller laser reflectance than the conductive layer 50. Non-limitative examples of the capping layer pattern (CP) may include a silicon oxide layer. The conductive layer 50 may be formed with a thickness of about 50 nm. The thickness should be about 50 nm so as to minimize or reduce reflection and effectively maintain heat of the conductive layer 50. Other constituent elements are substantially equivalent to the manufacturing method explained in FIG. 1A to FIG. 1D.

FIG. 3A to FIG. 3G are cross-sectional views for explaining an example of applying the selective ohmic contact formation method according to example embodiments to manufacture a wide band gap (WBG) power device.

Figure 3A:
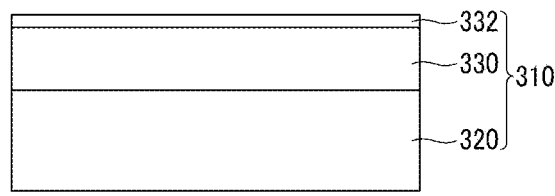
FIG. 3A to FIG. 3G are cross-sectional views for explaining an example of applying the selective ohmic contact formation method according to example embodiments to manufacture a wide band gap (WBG) power device.

Referring to FIG. 3A, an epitaxial substrate 310 is prepared that includes Group III-nitride heterojunction layers 330 and 332 on a semiconductor substrate 320.

FIG. 3A illustrates an epitaxial substrate 310 wherein a GaN layer 330 and an AlGaN layer 332 are heterojunctioned on a silicon substrate 320, as a non-limitative example of a substrate that may be used for a power device.

According to the kind and characteristic of a device, a transition layer may be further included between the GaN layer 330 and the silicon substrate 320. Although not shown in the drawing, a trench isolation or ion implantation process may be progressed to complete the device isolation process.

Figure 3B:
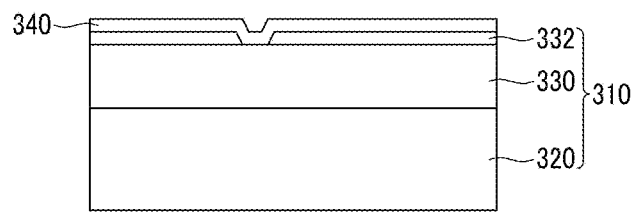

Referring to FIG. 3B, a part of the AlGaN layer 332 may be etched to define a region where a gate is to be formed. Subsequently, a gate insulating layer 340 may be formed on the epitaxial substrate 310. The gate insulating layer 340 may be formed of an aluminum oxide layer ($Al_2O_3$). The aluminum oxide layer 340 may be formed with a thickness of about 15 nm by atomic layer deposition.

Figure 3C:
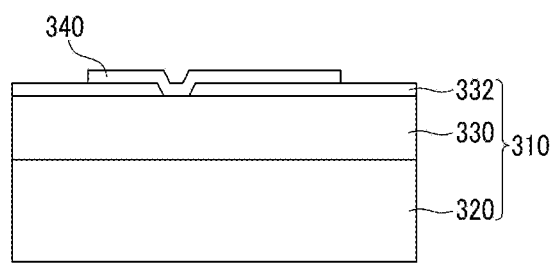

Referring to FIG. 3C, the gate insulating layer 340 formed on a source drain region requiring ohmic contact is removed to expose a source/drain region. Although FIG. 3C illustrates the case wherein the AlGaN layer 332 of the source/drain region is not removed, the AlGaN layer 332 may be etched and removed according to conditions.

If the AlGaN layer 332 is etched and removed, a contact area with 2DEG (two-dimensional electron gas) that is generated at the boundary between the AlGaN layer 332 and the GaN layer 330 is increased, thus reducing the contact area.

Figure 3D:
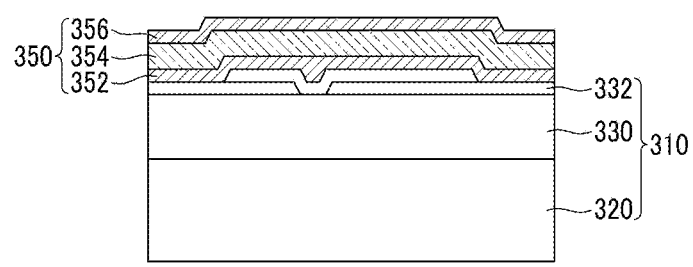
Figure 3E:
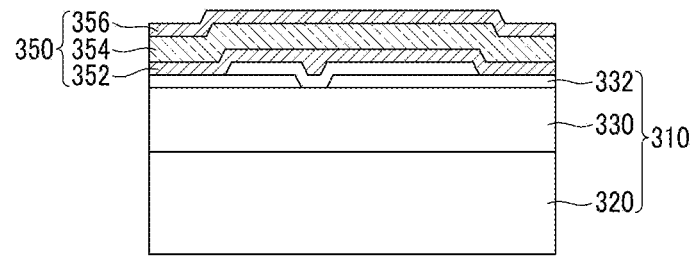

To the contrary, to alleviate a process burden due to etching of the AlGaN layer 332, the AlGaN layer 332 may be maintained. Referring to FIGS. 3D and 3E, a conductive layer 350 is formed on the substrate. The conductive layer 350 may be formed of a stacked layer of an oxidation-inhibiting conductive layer 356, an aluminum-based metal layer 354 and an ohmic contact metal layer 352.

FIG. 3D illustrates a TiN layer 356/an aluminum layer 354/a Ti layer 352 as a non-limitative example of the conductive layer that may be used for a power device.

Figure 3F:
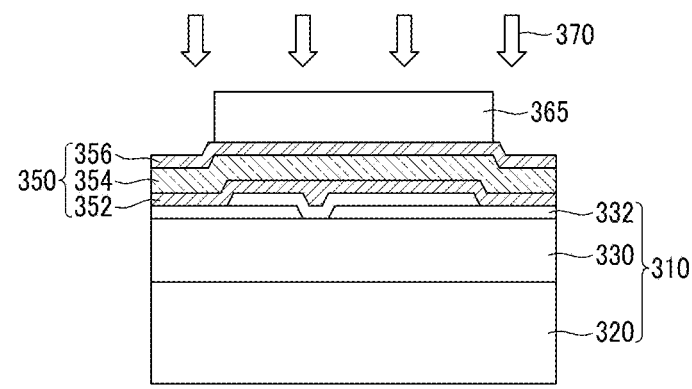

Referring to FIG. 3F, a capping layer pattern 365 is formed for masking the non-ohmic contact region other than the source/drain region requiring the ohmic contact.

Then, in a case where a rapid thermal process for completing the ohmic contact is progressed by laser annealing, the capping layer pattern 365 may be formed by depositing two layers of a laser reflective layer/a barrier film and patterning the two layers. Non-limitative examples of the layers constituting the capping layer pattern 365 may include a double layer of an aluminum layer and a silicon oxide layer. In a case where the rapid thermal process is progressed by induction annealing, the capping layer pattern 365 may be formed of a thermally conductive layer having improved thermal conductivity, and functions as a heat sink. Non-limitative examples of the layer constituting the capping layer pattern 365 may include an aluminum nitride layer.

Referring to FIG. 3F, on the substrate 300 on which the capping layer pattern 365 is formed, rapid thermal annealing 370 is conducted by laser annealing so that the AlGaN layer 332 and the Ti layer 352 may react to form an ohmic contact at the interface therebetween.

The laser annealing process may be irradiated under an air atmosphere at an energy density of about 200 to about 500 mJ/cm$^2$, and the process may be conducted at room temperature to about 600° C., for example, about 300 to about 500° C.

Because the capping layer pattern 365 reflects most of the incident laser during laser annealing, the lower gate insulating layer 340 is not crystallized or dehydrogenated due to thermal stress.

As the thermal annealing 370, induction annealing may be used instead of the laser annealing, and the induction annealing may be conducted for about 1 sec to about 30 sec under conditions of an induction field of about 1-20 kHz, and a coil current of about 10-100 A.

During the induction annealing, the capping layer pattern 365 may function as a heat sink to effectively decrease thermal stress applied to the gate insulating layer 340.

Figure 3G:
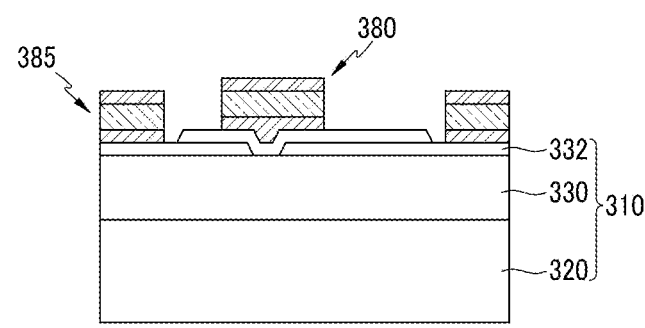

Referring to FIG. 3G, the capping layer pattern 365 is removed, and the conductive layer 350 is patterned to respectively form a gate electrode 380 and a source/drain electrode 385.

For subsequent processes, those known to a person of ordinary skill in the art and various modified processes thereof may be applied to complete a power device.

According to the example of the manufacturing method of the power device illustrated in FIGS. 3A-3G, the ohmic contact may be completed at a relatively low temperature of from room temperature to about 600° C., for example, about 300 to about 500° C. Thus, damage to the gate insulating layer that is exposed to the annealing process for forming the ohmic contact may be decreased.

Further, during the annealing process, because the gate insulating layer is masked with the capping layer, minimal or relatively little thermal stress is applied to the gate insulating layer, and thus crystallization and dehydrogenation of the gate insulating layer may be effectively prevented or inhibited.

The gate electrode is formed of a material to which an etching process may be applied, such as the material constituting the source/drain electrode, and is formed by etching. Thus, economically feasibility and reproducibility of the process may be increased. Also, because the gate electrode and the source/drain electrode may be simultaneously formed, the process may be simplified.

FIG. 4A to FIG. 4E are cross-sectional views explaining another example of applying the selective ohmic contact formation method according to example embodiments to manufacture a wide band gap (WBG) power device.

Figure 4A:
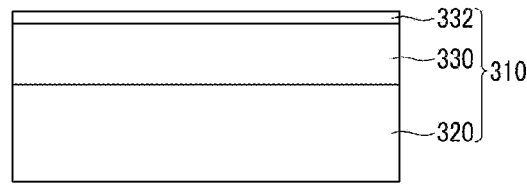
FIG. 4A to FIG. 4E are cross-sectional views explaining another example of applying the selective ohmic contact formation method according to example embodiments to manufacture a wide band gap (WBG) power device.

Referring to FIG. 4A, like the example of the manufacturing method of a power device illustrated in FIGS. 3A-3G, an epitaxial substrate 310 including Group III-nitride heterojunction layers 330 and 332 are formed on a semiconductor substrate 320. For example, an AlGaN 332/GaN 330/Si 320 epitaxial substrate 310 is prepared. Although not shown in the drawing, a common trench isolation or ion implantation process is progressed to complete the device isolation process.

Figure 4B:
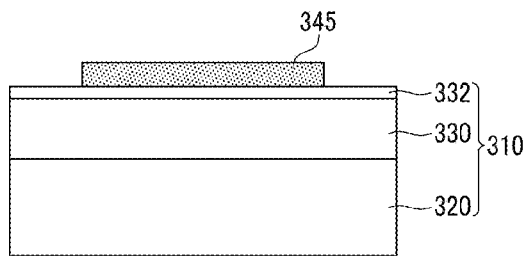

Referring to FIG. 4B, a capping layer pattern 345 is formed on the AlGaN layer 332. In case the rapid thermal annealing is conducted by laser annealing like the example of the power device manufacturing method illustrated in FIGS. 3A-3G, the capping layer pattern 345 may be formed of a double layer of a laser reflective layer/a barrier film, and in case the rapid thermal annealing is conducted by induction heating, the capping layer pattern 345 may be formed of a thermally conductive layer. FIG. 6 illustrates the double layer structure of the capping layer CP, according to an example embodiment. The CP layer may include a laser reflective layer 610 and a barrier film 620.

For specific kinds of the material and formation method, the same may be applied as explained above, and the explanations thereof are omitted.

Figure 4C:
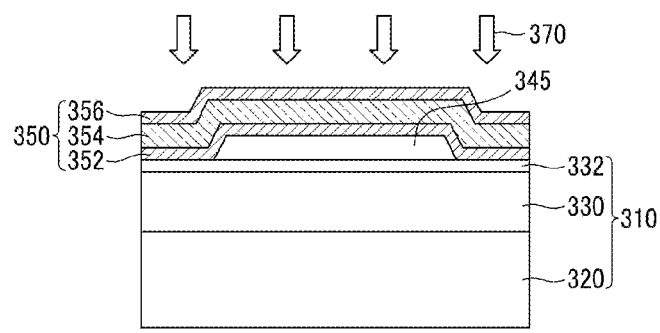

Referring to FIG. 4C, a conductive layer 350 may be formed on the substrate including the capping layer pattern 345, and then rapid thermal annealing is conducted on the conductive layer 350.

The conductive layer 350 may be formed of a TiN layer 356/an aluminum layer 354/a Ti layer 352 like the example of the power device manufacturing method illustrated in FIGS. 3A-3G, or a TaN layer may be formed instead of a TiN layer.

After forming the conductive layer 350, rapid thermal annealing 370 is conducted so that the Ti layer 352 and the AlGaN layer 332 react with each other, to form an ohmic contact at the interface therebetween.

The rapid thermal annealing 370 may be conducted at a relatively low temperature of less than or equal to about 750° C., for example, room temperature to about 600° C., or about 300 to about 500° C., by laser annealing or induction annealing, as explained in the example of the power device manufacturing method illustrated in FIGS. 3A-3G.

Specific conditions of the laser annealing or induction annealing may be substantially equivalent to those of the example of the power device manufacturing method illustrated in FIGS. 3A-3G.

Figure 4D:
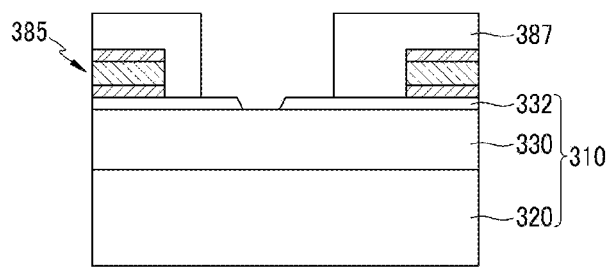

Referring to FIG. 4D, a conductive layer 350 having a completed ohmic contact is patterned to respectively form a source/drain electrode 385. A passivation layer 387 is formed on the epitaxial substrate 310 on which source/drain electrode 385 is formed, and then patterned to expose a channel region.

Figure 4E:
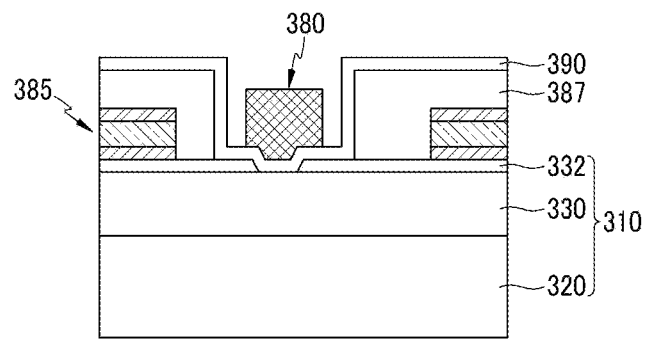

Referring to FIG. 4E, after removing the AlGaN layer 332 of the region where a channel is to be formed, a gate insulating layer 390 is formed. A gate electrode is deposited on the gate insulating layer 390 and then patterned to form a gate electrode 380. The gate electrode may be formed of the same material as the source/drain electrode, or may be formed of a different material from the source/drain electrode.

If the gate electrode is formed of a different material, the threshold voltage (Vth) of the power device may be effectively controlled. The gate electrode 380 may be formed of a metal having a relatively high melting point (refractory metal) or a compound thereof, for example, tantalum (Ta), tantalum nitride (TaN), titanium nitride (TiN), palladium (Pd), tungsten (W), or tungsten silicide (WSi$_2$).

For subsequent processes, those known to a person of ordinary skill in the art and various modified processes may be applied to complete a power device.

According to the example of the power device manufacturing method illustrated in FIGS. 4A-4E, an ohmic contact may be completed at a relatively low temperature of from room temperature to about 600° C., for example, about 300 to about 500° C., and then a gate insulating layer is formed.

Thus, crystallization or dehydrogenation of a gate insulating layer that may occur during conventional ohmic contact formation may be basically prevented or inhibited.

Further, because the gate electrode is formed of a material to which an etching process may be applied, and is formed by etching, economic feasibility and reproducibility of the process may be increased.

FIG. 5A to FIG. 5D are cross-sectional views for explaining another example of applying the selective ohmic contact formation method according to example embodiments to manufacture a wide band gap (WBG) power device.

Figure 5A:
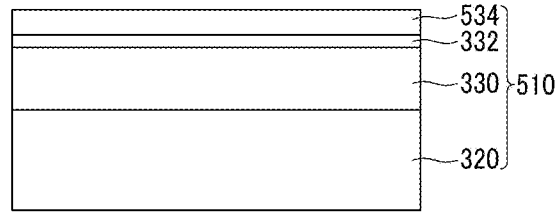
FIG. 5A to FIG. 5D are cross-sectional views for explaining another example of applying the selective ohmic contact formation method according to other example embodiments to manufacture a wide band gap (WBG) power device.

Referring to FIG. 5A, an epitaxial substrate 510 is prepared. The epitaxial substrate 510 further includes a p-type Group III-nitride layer 534 on the second Group III-nitride layer 332, unlike the epitaxial substrate 310 used in the example illustrated in FIGS. 3A-3G and the example illustrated in FIGS. 4A-4E.

Non-limiting examples of the epitaxial substrate 510 may include a stacking structure consisting of a p-type GaN layer 534/an AlGaN layer 332/a GaN layer 330/a Si substrate 320. The p-type GaN layer 534 may have a thickness of about 100 Å to about 2000 Å. The p-type GaN gate layer may have a doping concentration of about 1018 to about 1021 atom/cm³.

Although not shown in the drawing, a common trench isolation or ion implantation process is progressed to complete a device isolation process. In case the p-type GaN layer 534 is formed, a gate insulating layer does not need to be separately formed.

Figure 5B:
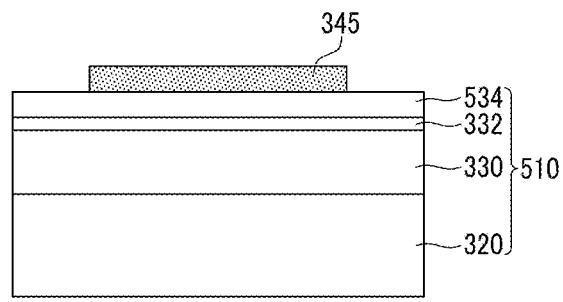

Referring to FIG. 5B, a capping layer pattern 345 may be formed on the p-type GaN layer 534. Because the capping layer pattern 345 is formed in the same manner as the example of the power device manufacturing method illustrated in FIGS. 4A-4E, explanation thereof is omitted.

Figure 5C:
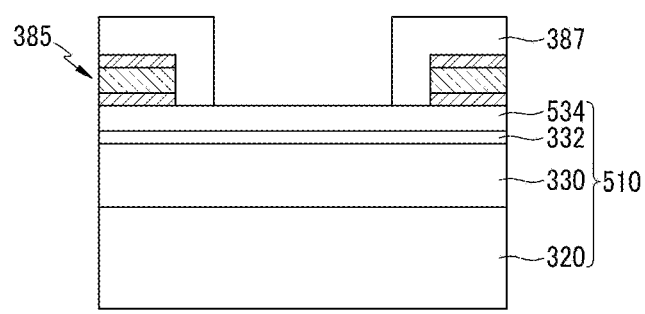

Referring to FIG. 5C, a conductive layer (not shown) is formed on the capping layer pattern 345, the ohmic contact is formed by low-temperature rapid thermal annealing, and then the conductive layer having the ohmic contact is patterned to form a source/drain electrode 385. A passivation layer 387 is formed on the epitaxial substrate 310 on which the source/drain electrode 385 is formed and is then patterned to expose a channel region in the same manner as FIG. 4C to FIG. 4D.

Figure 5D:
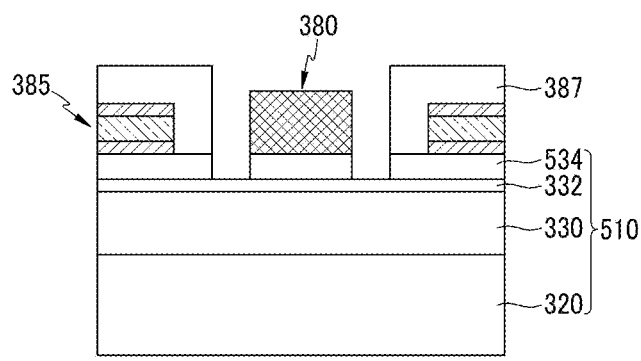

Referring to FIG. 5D, a metal for a gate electrode is deposited on the epitaxial substrate 310, and is then patterned together with the lower p-type GaN layer 534 using a single photomask to form a gate electrode 380.

For subsequent processes, those known to a person of ordinary skill in the art and various modified processes thereof may be applied to complete a power device.

According to the example of a manufacturing method of a power device illustrated in FIGS. 5A-5D, the ohmic contact is completed at a relatively low temperature of from room temperature to about 600° C., for example, about 300 to about 500° C.

Thus, in the annealing process for forming the ohmic contact, impurities of the capping layer such as hydrogen may be diffused to bind with a dopant, thereby preventing or inhibiting deterioration of characteristics.

Further, in the annealing process, the channel region is masked with the capping layer so that minimal or relatively little heat may be transferred to the p-type GaN layer 534, and thus deterioration of device characteristics may be more effectively prevented or inhibited.

Also, because the gate electrode is formed of a material to which an etching process may be applied, and is formed by etching, economic feasibility and reproducibility of the process may be increased.

In addition, the gate metal layer and the lower p-type GaN layer may be simultaneously patterned with one mask to form a gate electrode and a p-type GaN gate, so the process may be simplified to increase economic feasibility.

While this disclosure has been described in connection with what is presently considered to be practical example embodiments, it is to be understood that the inventive concepts are not limited to the disclosed embodiments, but, on the contrary, is intended to cover various modifications and equivalent arrangements included within the spirit and scope of the appended claims.

What is claimed is:

1. A method for forming a selective ohmic contact for a Group III-nitride heterojunction structured device, comprising:
    forming a conductive layer and a capping layer on an epitaxial substrate including at least one Group III-nitride heterojunction layer and having a defined ohmic contact region, the capping layer being formed on the conductive layer or between the conductive layer and the Group III-nitride heterojunction layer in one of the ohmic contact region and non-ohmic contact region; and
    applying at least one of a laser annealing process and an induction annealing process on the substrate at a temperature of less than or equal to about 750° C. to complete the selective ohmic contact in the ohmic contact region
    wherein the capping layer includes a double layer having two heterogeneous layers, one of the two heterogeneous layers including a silicon oxide layer.

2. The method for forming the selective ohmic contact of claim 1, wherein
    the capping layer is formed on the non-ohmic contact region.

3. The method for forming the selective ohmic contact of claim 2, wherein
    the double layer includes a laser reflective layer and a barrier film,
    the laser reflective layer includes an aluminum layer, and
    the barrier film includes the silicon oxide layer.

4. The method for forming the selective ohmic contact of claim 2, wherein
    the capping layer includes a thermally conductive layer, and
    the thermally conductive layer includes one selected from a silicon nitride layer, an aluminum nitride layer, a boron nitride layer, an aluminum oxide layer, and a beryllium oxide layer.

5. The method for forming the selective ohmic contact of claim 1, wherein
    the capping layer is formed on the non-ohmic contact region, and
    the capping layer includes a material having a smaller laser reflectance than the conductive layer.

6. The method for forming the selective ohmic contact of claim 5, wherein the silicon oxide layer has a thickness of about 50 nm.

7. The method for forming the selective ohmic contact of claim 1, wherein
    the at least one Group III-nitride heterojunction layer includes a first Group III-nitride layer and a second Group III-nitride layer,
    the first Group III-nitride layer is one of a GaN layer and an InGaN layer, and
    the second Group III-nitride layer is one of an AliGaN layer, an AlInN layer, an AlGaInN layer, and an AlN layer.

8. The method for forming the selective ohmic contact of claim 1, wherein a laser used in the laser annealing process is one of the laser is a pulsed KrF 248 nm laser and a XeCl 308 nm laser.

* * * * *